United States Patent [19]

Honjo

[11] Patent Number: 5,202,752
[45] Date of Patent: Apr. 13, 1993

[54] MONOLITHIC INTEGRATED CIRCUIT DEVICE

[75] Inventor: Kazuhiko Honjo, Tokyo, Japan

[73] Assignee: NEC Corporation, Tokyo, Japan

[21] Appl. No.: 699,279

[22] Filed: May 13, 1991

[30] Foreign Application Priority Data

May 16, 1990 [JP] Japan .................................. 2-126158
May 16, 1990 [JP] Japan .................................. 2-126159

[51] Int. Cl.$^5$ .............................................. H01P 3/08
[52] U.S. Cl. .................................... 257/678; 333/247; 333/246; 333/81 A; 307/299.1; 257/702; 257/692; 257/728; 257/730
[58] Field of Search .......................... 357/81, 65, 68; 333/246, 81 A, 247; 330/286; 307/299

[56] References Cited

U.S. PATENT DOCUMENTS

| | | | |
|---|---|---|---|
| 3,982,271 | 9/1976 | Olivieri et al. | 357/81 |
| 3,986,196 | 10/1976 | Decker et al. | 357/81 |
| 4,152,718 | 5/1979 | Cachier | 357/81 |
| 4,232,326 | 11/1980 | Neidig et al. | 357/65 |
| 4,374,392 | 2/1983 | Reichert | 357/65 |
| 4,374,394 | 2/1983 | Camisa | 357/81 |
| 4,376,287 | 3/1983 | Sechi | 357/81 |
| 4,837,536 | 6/1989 | Honjo | 357/67 |
| 4,970,578 | 11/1990 | Tong et al. | 357/71 |
| 5,027,189 | 6/1991 | Shannon et al. | 357/65 |

Primary Examiner—Jerome Jackson, Jr.
Assistant Examiner—Viet Q. Nguyen
Attorney, Agent, or Firm—Laff, Whitesel, Conte & Saret

[57] ABSTRACT

According to this invention, a monolithic integrated circuit device includes a semiconductor element, a metal ground film and a plurality of electrodes of the semiconductor element, first and second microstrip conductors, and a pair of via hole circuits. A semiconductor element is formed in a predetermined region on the first surface of a semi-insulating compound semiconductor substrate. A metal ground film and a plurality of electrodes of the semiconductor element are independently formed on the first surface of the semiconductor substrate. First and second microstrip conductors are formed on the second surface of the semiconductor substrate. A pair of via hole circuits connect the microstrip electrodes to input and output electrodes of the high-power semiconductor element, respectively.

6 Claims, 4 Drawing Sheets

MONOLITHIC INTEGRATED CIRCUIT DEVICE

BACKGROUND OF THE INVENTION

The present invention relates to a semiconductor device and, more particularly, to a high-power monolithic microwave integrated circuit device using a compound semiconductor and to a monolithic microwave/millimeter-wave array antenna module.

In recent years, a high-power compound semiconductor device has been rapidly developed. A high-power GaAs FET of several tens W in a C band and a high-power HBT (heterojunction bipolar transistor) of several W in an X band have been developed. In these high-power devices, in order to keep reliability, the temperature of an operating layer must be suppressed to be a predetermined value or less. For this reason, heat resistance must be decreased. More specifically, in an HBT having a large amount of current per unit area (the amount is about three times that of a GaAs FET), a power density is increased to almost three times that of the GaAs FET. Therefore, the heat resistance must be $\frac{1}{3}$ or less that of the GaAs FET.

Methods of largely decreasing heat resistance are roughly classified into two types of methods. The first method is a method of thinning a semiconductor substrate. FIG. 7A is a sectional view showing the first conventional method. In FIG. 7A, an HBT comprising an n-type GaAs collector layer 30, a p+-type GaAs base layer 31, and an n-type AlGaAs emitter layer 32 is formed on a semi-insulating GaAs substrate 21. Reference numeral 25 denotes an emitter electrode of the HBT. A collector electrode 27 of the HBT is connected to an output microstrip conductor 23, and a base electrode 26 of the HBT is connected to an input microstrip conductor 24. A ground metal layer 22 is formed on the lower surface of the GaAs substrate 21. In FIG. 7A, in order to decrease the heat resistance of the substrate to $\frac{1}{3}$, a thickness t of the substrate must be decreased to $\frac{1}{3}$. At this time, since an electrostatic capacitance between the microstrip conductors 23 and 24 and the ground metal layer 22 is increased to be about three times, the characteristic impedance is decreased to about $1/\sqrt{3}$. Therefore, in order to keep the characteristic impedance, the widths of the microstrip conductors 23 and 24 must be decreased to $\frac{1}{3}$. In this case, since the series resistance of this line is increased, the transmission loss of the microstrip line is disadvantageously increased. In addition, a thinned substrate is easy to break and therefore difficult to handle.

As the second conventional method of decreasing heat resistance, a flip-chip structure shown in FIG. 7B is used. In FIG. 7B, an HBT comprising an n-type GaAs collector layer 30, a p+-type GaAs base layer 31, and an n-type AlGaAs emitter layer 32 is formed upside down. The emitter electrode of the HBT is directly connected to a ground metal block 41 by a thermocompression bonding method. The ground metal block 41 radiates a heat. A base electrode 36 is connected to an input microstrip conductor 39 arranged on an alumina substrate 40 formed on a ground metal block 41, and a collector electrode 37 is connected to an output microstrip conductor 38 arranged on the alumina substrate 40 formed on the ground metal block 41. When the conventional flip-chip structure is used, although the heat resistance can be extremely decreased, the input and output microstrip circuits cannot be formed to be monolithic.

That is, in the conventional method in FIG. 7A, although a monolithic HBT including circuits can be obtained, transmission loss is disadvantageously increased in order to decrease heat resistance. In the conventional method in FIG. 7B, although heat resistance can be largely decreased, a monolithic IC cannot be obtained.

In addition, when not only a transmitting/receiving module such as the microwave/millimeter-wave radar device but an antenna element are monolithically integrated, about several hundreds antenna elements each having a transmitting/receiving module can be arranged on a large-diameter GaAs wafer in an array form, and a monolithic microwave array antenna module for a phased array radar can be obtained. The above prior art is summarized in the Microwave Journal, July, 1986, p. 119.

FIG. 8 is a sectional view showing a conventional monolithic microwave array antenna module. In FIG. 8, an active element circuit 162 including a low-noise amplifier, a mixer, a switch, a power amplifier, a phase shifter, and an A/D converter, and a microstrip dipole antenna 122 are formed on the surface of a semi-insulating GaAs substrate 101 having a ground metal layer 102 on its lower surface.

In addition to the problem of heat resistance described above with reference to FIGS. 7A and 7B, a problem to be solved in the conventional method in FIG. 8 will be described below. The relative dielectric constant $\epsilon_r$ of GaAs is 12.7, and the wavelength shortening ratio of GaAs is about 0.33. Thus, the width of a half-wave microstrip dipole antenna 22 must be set to be 1.25 mm at a frequency of 40 GHz. However, a wavelength $\lambda_g/2$ of a half-wave of a 40-GHz electromagnetic wave is 3.75 mm in a free space, and this value is largely different from the above value of 1.25 mm. It causes high current density. Therefore, energy input to the microstrip dipole antenna is not effectively radiated to the space, because of antenna conductor loss.

SUMMARY OF THE INVENTION

It is an object of the present invention to provide a monolithic integrated circuit capable of simultaneously largely decreasing heat resistance and obtaining a monolithic IC with a low transmission loss.

It is another object of the present invention to provide a high-power monolithic integrated circuit.

It is still another object of the present invention to provide a monolithic integrated circuit free from break down.

It is still another object of the present invention to provide a monolithic integrated circuit which is optimally applied to a highly reliable monolithic microwave/millimeter-wave array antenna module having high antenna efficiency and low heat resistance.

In order to achieve the above objects of the present invention, there is provided a monolithic integrated circuit device comprising a semiconductor element formed in a predetermined region on a first surface of a semi-insulating compound semiconductor substrate, a metal ground film and a plurality of electrodes of the semiconductor element independently formed on the first surface of the semiconductor substrate, first and second microstrip conductors formed on a second surface of the semiconductor substrate, and a pair of via hole circuits for connecting the microstrip electrodes to input and output electrodes of the high-power semiconductor element, respectively.

DESCRIPTION OF THE PREFERRED EMBODIMENTS

Figure 1A:
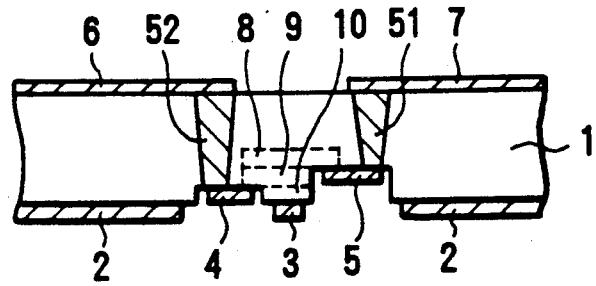
FIGS. 1A to 1C are views showing a high-power monolithic microwave integrated circuit device according to the first embodiment of the present invention.
Figure 1B:
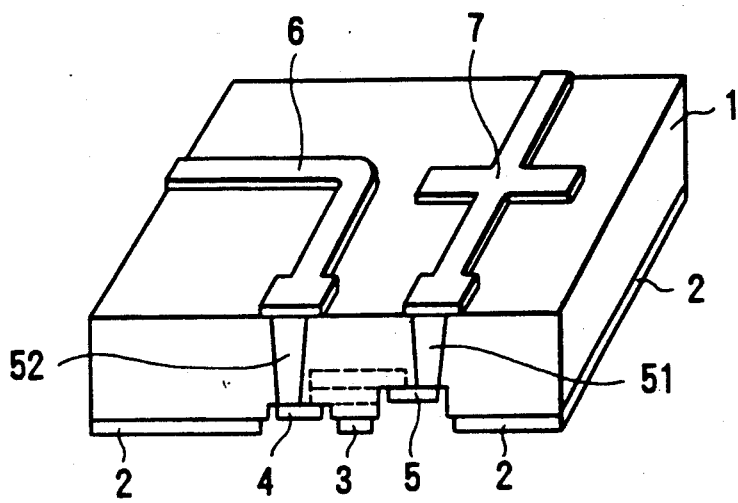
Figure 1C:
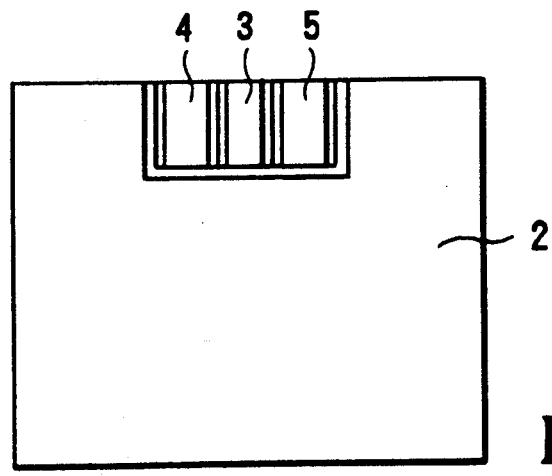

FIGS. 1A to 1C show a high-power monolithic microwave integrated circuit device according to the first embodiment of the present invention in which FIG. 1A is a sectional view of the circuit device, FIG. 1B is a perspective view of FIG. 1A, and FIG. 1C is a view showing the lower surface of FIG. 1A. In FIGS. 1A to 1C, a high-power HBT comprising an n-type GaAs collector layer 8, a p+-type GaAs base layer 9, and an n-type AlGaAs emitter layer 10 is formed on the first surface of a semi-insulating GaAs substrate 1. A collector electrode 5 of the HBT is connected to an output microstrip conductor 7 formed on the second surface of the substrate 1 through a via hole circuit 51, and a base electrode 4 of the HBT is connected to an input microstrip conductor 6 formed on the second surface of the substrate 1 through a via hole circuit 52. Reference numeral 2 denotes a ground metal layer formed on the first surface of the substrate 1, and reference numeral 3 denote an emitter electrode. The ground metal layer 2 and the emitter electrode 3 have the same thickness and are formed on the same plane.

Figure 2A:
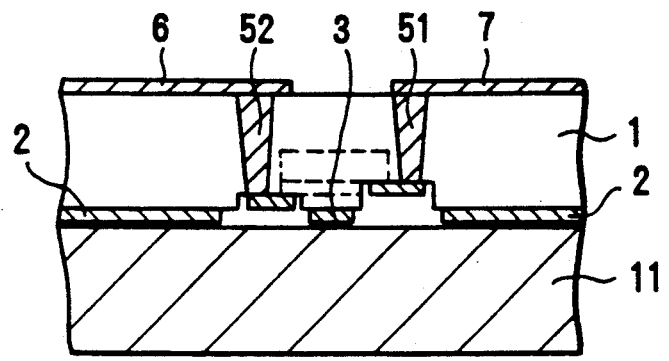
FIGS. 2A and 2B are sectional views showing a mounted state of the device of the embodiment in FIG. 1.
Figure 2B:
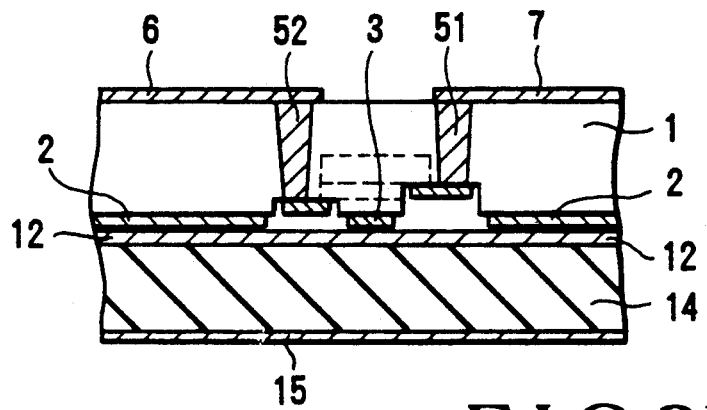

FIGS. 2A and 2B show a mounted state of the high-power monolithic integrated circuit according to the embodiment in FIGS. 1A to 1C. FIG. 2A shows the high-power monolithic integrated circuit which is mounted on a metal block 11, and FIG. 2B shows the high-power monolithic integrated circuit which is mounted on an insulating substrate 14 made of, e.g., diamond II or beryllia, and having high heat conductivity. Reference numeral 12 denotes a ground surface.

In the above high-power monolithic microwave integrated circuit device according to the present invention, since the heat generation portion of a high-power element is connected not through a GaAs substrate having low heat conductivity but directly to a heat sink, the high-power element has very low heat resistance. In addition, since the thickness of the GaAs substrate can be kept large, the width of the microstrip conductor need not be excessively small, and loss of the microstrip circuit can be decreased. Therefore, the present invention has a significant effect in the microwave/millimeter-wave technology.

In the above embodiment, the HBT is used as a high-power semiconductor element. However, the present invention is not limited to the embodiment, but a Schottky gate FET, a MISFET, a HEMT, or the like may be used as the high-power semiconductor element. In addition, the semiconductor material is not limited to a GaAs compound, but a Group III-V compound semiconductor such as an InP or GaSb compound and a Group II-VI compound semiconductor may be used as the semiconductor material.

According to the present invention, a high-power monolithic microwave integrated circuit device capable of decreasing heat resistance and obtaining a monolithic IC having a low transmission loss can be obtained.

Figure 3:
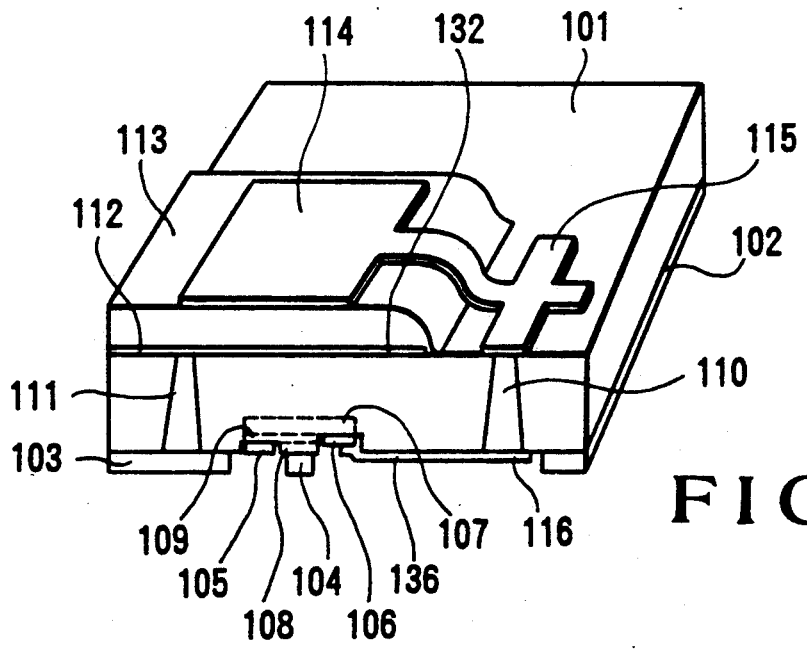
FIG. 3 is a view showing an array antenna module according to the second embodiment of the present invention.

FIG. 3 is a view showing a monolithic microwave/millimeter-wave array antenna module according to the second embodiment of the present invention. In FIG. 3, a heterojunction bipolar transistor (HBT) constituted by a collector layer 107 made of n-type GaAs, a base layer 109 made of p+-type GaAs, and an emitter layer 108 made of n-type AlGaAs is formed on the lower surface, i.e., the first surface, of a semi-insulating GaAs substrate 101. If desired, other compound semiconductor materials such as InP and GaP may be used. A collector electrode 106 of the HBT is connected to collector circuits 136 and 116. The collector circuit 116 is connected to a microstrip matching circuit 115 formed on the second surface of the substrate 101 through a via hole circuit 110 and to a patch antenna 114 on a polyimide film 113. A ground metal layer 112 is stacked between the substrate 101 and the polyimide 113. The ground metal layer 112 is connected to a chip ground metal layer 103 through a via hole circuit 111. Reference numeral 105 denotes the base electrode of the HBT, and reference numeral 104 denotes an emitter electrode of the HBT. A second chip ground metal layer 102, the emitter electrode 104, and the chip ground metal layer 103 have the same thickness and are formed on the same plane. The matching circuit and the collector circuit 136 respectively constitute a microstrip circuit having the same thickness as that of the GaAs substrate and a ground metal layer on its opposite surface. In fact, a large number of modules are formed in the same wafer, and one wafer constitutes a part of an active phased array radar system or a radar system.

Figure 4:
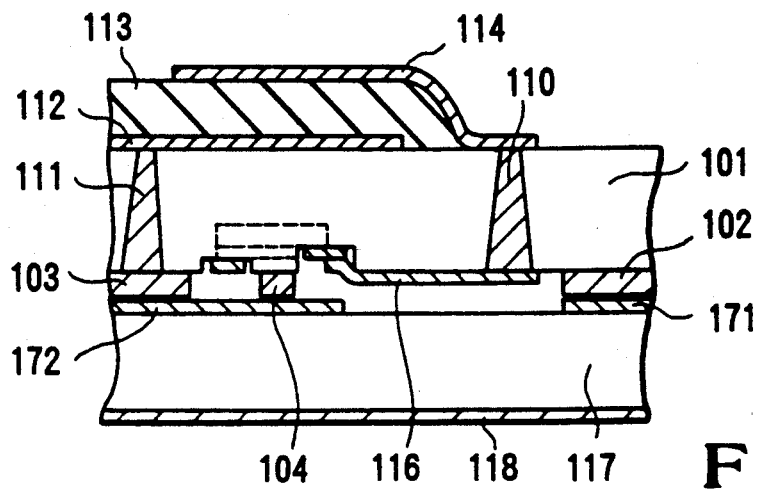
FIGS. 4 and 5 are sectional views showing a mounted state of the array antenna module of the second embodiment in FIG. 3.

FIG. 4 is a sectional view showing a mounted state of the elements of the embodiment in FIG. 3. An emitter electrode 104 and chip ground metal layer 102 and 103 are constituted to be in contact with ground metal layers 172 and 171 by a thermocompression bonding method or the like. The ground metal layers 172 and 171 are formed on a diamond II 117 serving as an insulator having high heat conductivity. Reference numeral 118 denotes a ground metal layer.

Figure 5:
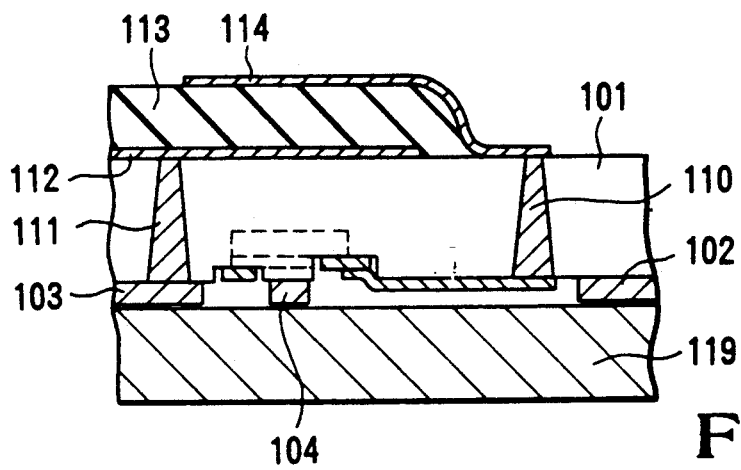

FIG. 5 is a sectional view showing the elements in which a metal block 119 is used in place of the diamond II 117.

Figure 6:
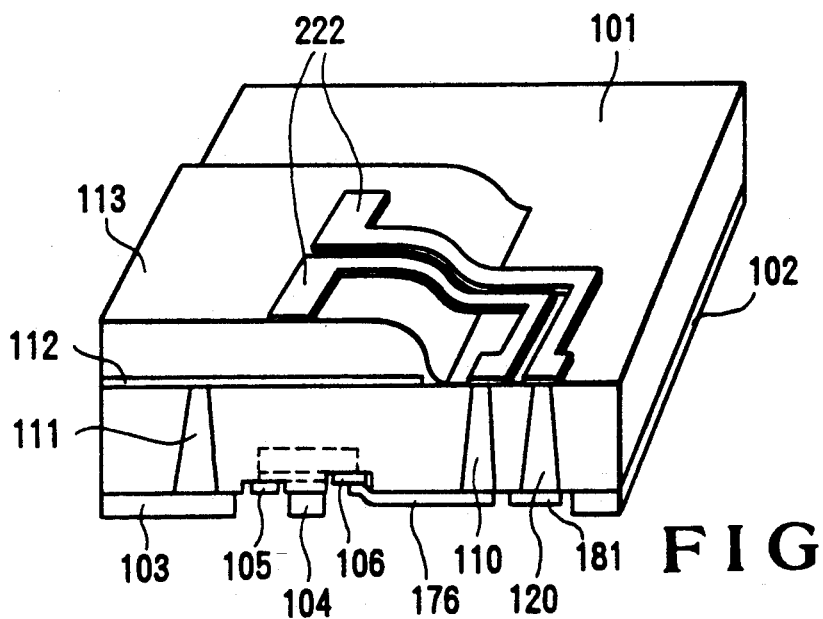
FIG. 6 is a sectional view showing the third embodiment of the present invention.
Figure 7A:
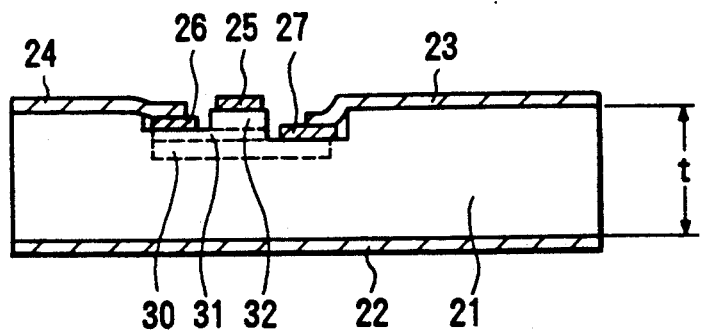
FIGS. 7A and 7B are sectional views showing a conventional high-power monolithic microwave integrated circuit.
Figure 7B:
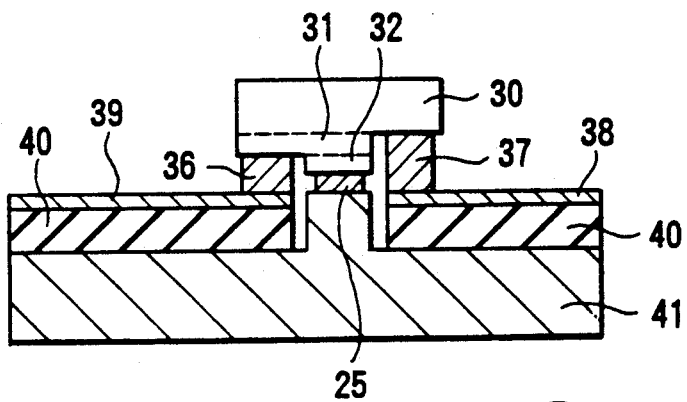
Figure 8:
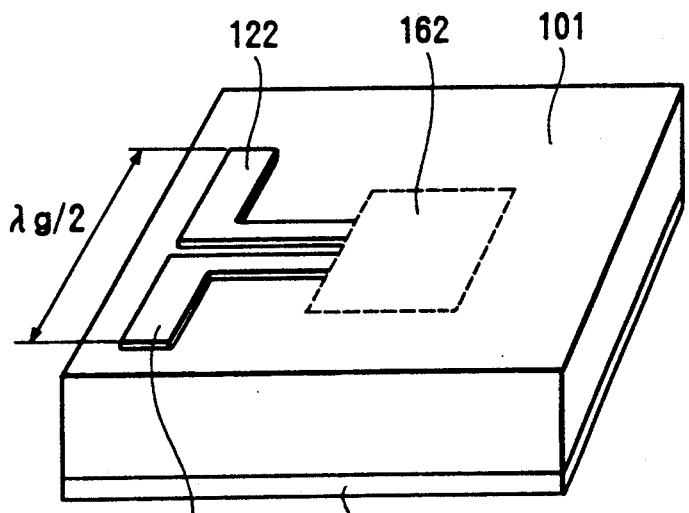
FIG. 8 is a perspective view showing a conventional antenna array module.

FIG. 6 is a sectional perspective view showing a monolithic microwave/millimeter-wave antenna module according to the third embodiment of the present invention. Unlike the embodiment shown in FIG. 3, a microstrip dipole antenna 122 is used as an antenna element, and via hole circuits 110 and 120 are connected to output terminals 176 and 181 of a balun.

In the embodiment of the present invention, a heat-generating active element is formed on the lower surface of a chip and directly connected to a ground layer having high heat conductivity to decrease the heat resistance of the active element. Since an antenna element is formed on a polyimide film having a relative dielectric constant εr of about 3, antenna efficiency is increased. In addition, since the matching circuit 115 formed on the upper surface and the collector circuit 36 formed on the lower surface serve as microstrip circuits using GaAs (εr=12.7) substrates each having a large wavelength shortening ratio, circuits except for the antenna circuit can be formed to be compact. Note that not only polyimide but other materials may be used as a dielectric having low dielectric constant constituting the antenna element.

According to the present invention, a highly reliable monolithic microwave/millimeter-wave array antenna module having high antenna efficiency and low heat resistance can be obtained.

What is claimed is:

1. A semiconductor device comprising:
   a semiconductor element formed in a first main surface of a substrate;
   a first metal ground film and an electrode independently formed on the first main surface of said substrate, said electrode being connected to said semiconductor element,
   a second metal ground film formed on a second main surface of said substrate;
   a microstrip antenna conductor formed on a dielectric film, said dielectric film being formed on said second metal ground film;
   a first via hole conductor formed in said substrate to connect said first metal ground film to said second metal ground film; and
   a second via hole conductor formed in said substrate to connect said electrode to said microstrip antenna conductor.

2. A device according to claim 1, wherein said microstrip antenna conductor is a microstrip dipole antenna conductor.

3. A device according to claim 1, wherein said microstrip antenna conductor is a microstrip patch antenna conductor.

4. A device according to claim 1, wherein said second via hole conductor connects said electrode to said microstrip antenna conductor through a matching circuit.

5. A device according to claim 1, wherein said semiconductor element has a ground electrode, said ground electrode and said first metal ground film are connected to a ground metal block.

6. A device according to claim 1, wherein said semiconductor element has a ground electrode, said ground electrode and said first metal ground film are connected to an electrode pattern on a semi-insulating conductor substrate.

* * * * *